United States Patent
Kuo et al.

(10) Patent No.: US 8,692,438 B2
(45) Date of Patent: Apr. 8, 2014

(54) POWER GENERATION DEVICE FOR PROVIDING ELECTRIC POWER BY UTILIZING MAGNETOCALORIC EFFECT

(75) Inventors: Chung-Jung Kuo, Taoyuan Hsien (TW); Tze-Chern Mao, Taoyuan Hsien (TW); Sheng-Fan Hsieh, Taoyuan Hsien (TW); Min-Tsz Lin, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 308 days.

(21) Appl. No.: 13/180,557

(22) Filed: Jul. 12, 2011

(65) Prior Publication Data

US 2012/0013219 A1 Jan. 19, 2012

Related U.S. Application Data

(60) Provisional application No. 61/389,289, filed on Oct. 4, 2010.

(30) Foreign Application Priority Data

Jul. 13, 2010 (CN) ...................... 2010 2 0262089 U

(51) Int. Cl.
*H02N 10/00* (2006.01)
*H01L 37/00* (2006.01)

(52) U.S. Cl.
USPC ......................................... 310/306; 310/307

(58) Field of Classification Search
USPC ................................. 310/306, 307
IPC ....................................................... H02N 10/00
See application file for complete search history.

(56) References Cited

U.S. PATENT DOCUMENTS

| 3,310,689 A * | 3/1967 | Heinmets ...................... 310/306 |
| 3,593,110 A * | 7/1971 | Huebener ..................... 310/306 |
| 5,397,948 A * | 3/1995 | Zoerner et al. .................. 310/46 |
| 2005/0062360 A1* | 3/2005 | Yabuta .......................... 310/306 |
| 2010/0109474 A1 | 5/2010 | Russberg et al. |
| 2011/0316385 A1* | 12/2011 | Erbil et al. .................... 310/306 |
| 2013/0106116 A1* | 5/2013 | Kuo et al. ..................... 290/1 R |

FOREIGN PATENT DOCUMENTS

| EP | 2113694 A1 | 11/2009 |
| JP | 07107764 A * | 4/1995 |
| WO | WO 2008116789 A1 * | 10/2008 |

OTHER PUBLICATIONS

Machine translation of JP07-107764 (translated May 20, 2013, published Apr. 21, 1995).*

* cited by examiner

*Primary Examiner* — Burton Mullins
*Assistant Examiner* — Michael Andrews
(74) *Attorney, Agent, or Firm* — CKC & Partners Co., Ltd.

(57) ABSTRACT

A power generation device is disclosed, which includes a plurality of thermomagnetic generator and a flow controller. The thermomagnetic generators can acquire first fluids respectively. The flow controller can control flow rates of the second fluids flowing into the thermomagnetic generators respectively, wherein a fluid temperature of the first fluid is different from a fluid temperature of the second fluid.

16 Claims, 7 Drawing Sheets

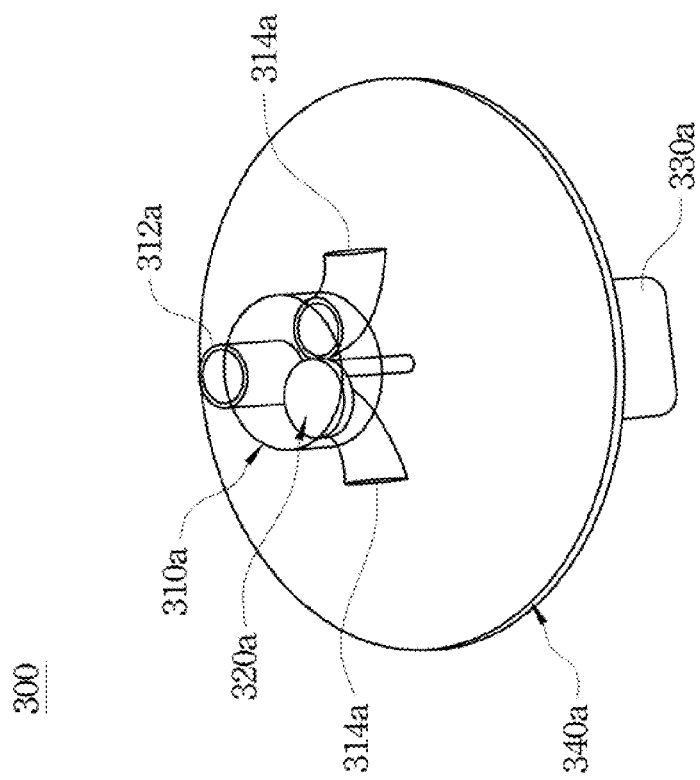
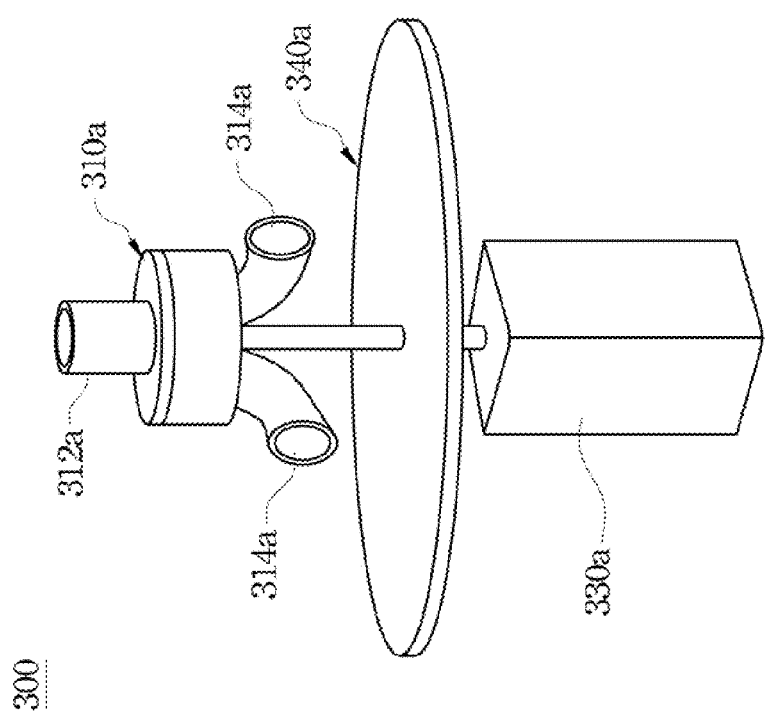
Fig. 4A
Fig. 4B

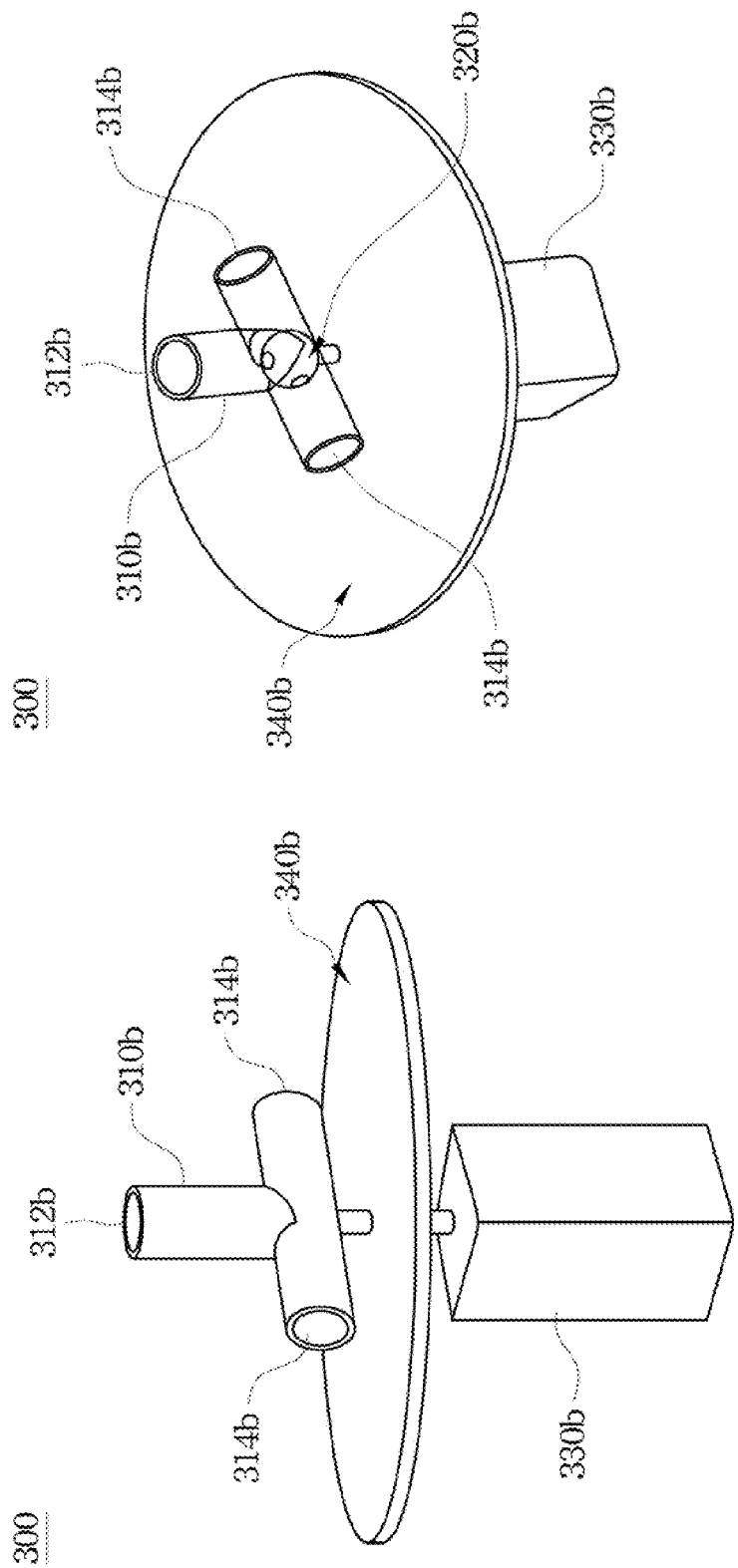

US 8,692,438 B2

POWER GENERATION DEVICE FOR PROVIDING ELECTRIC POWER BY UTILIZING MAGNETOCALORIC EFFECT

RELATED APPLICATIONS

This application claims priority to Chinese Application Serial Number 201020262089.6, filed Jul. 13, 2010 and U.S. Provisional Application Ser. No. 61/389,289, filed Oct. 4, 2010, which are herein incorporated by references.

BACKGROUND

1. Technical Field

The present disclosure relates to energy supply, and more particularly, power generation devices.

2. Description of Related Art

The magnetocaloric effect (MCE, from magnet and calorie) is a magneto-thermodynamic phenomenon in which a reversible change in temperature of a suitable material is caused by exposing the material to a changing magnetic field.

Thermodynamic cycles that take advantage of the magnetocaloric effect can be in wide use. For human beings that suffer from environmental pollution and energy shortage, there is an urgent need in the related field to provide power by utilizing the magnetocaloric effect.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one or more various aspects, the present disclosure is directed to power generation devices for providing electric power by utilizing the magnetocaloric effect.

According to one embodiment of the present invention, a power generation device includes a plurality of thermomagnetic generators and a flow controller. Each of the thermomagnetic generators includes a thermomagnetic material, a coil and a fluidic mixer. The coil surrounds the thermomagnetic material. The fluidic mixer can mix a first fluid with the second fluid and can output the mixed fluid to the thermomagnetic material, wherein a fluid temperature of the first fluid is different from a fluid temperature of the second fluid. The flow controller can control flow rates of the second fluids flowing into the thermomagnetic generators respectively.

According to another embodiment of the present invention, a power generation device includes a plurality of thermomagnetic generator and a flow controller. The thermomagnetic generators can acquire first fluids respectively. The flow controller can control flow rates of the second fluids flowing into the thermomagnetic generators respectively, wherein a fluid temperature of the first fluid is different from a fluid temperature of the second fluid.

In use, the flow rates of the second fluids flowing into the respective thermomagnetic generators are changed by means of the flow controller, and therefore a temperature of the mixed fluid that flows to each thermomagnetic material is changed, so that the thermomagnetic material can alternate between a permeability and a non-permeability (or between a high permeability and a low permeability) according as sufficiently low and high temperature of the mixed fluid is applied by turns. Thus, the coil can be induced to generate power.

The power generation device further comprises at least one third fluid. The fluidic mixer mixes the first fluid, the second fluid and the third fluid for outputting the mixed fluid to the thermomagnetic material. A fluid temperature of the third fluid is different from the fluid temperature of the first fluid and the fluid temperature of the second fluid. Each of the third fluids has a different temperature, respectively.

Technical advantages are generally achieved, by embodiments of the present invention, as follows:

1. It is no need to use electromagnetic valves to block fluid. Therefore, energy saving can be accomplished; and 2. The electromagnetic pump or solenoid valve must completely cut off fluid flow, which results in serious mechanical friction and power dissipation. The flow controller guides and distributes fluid to the respective thermomagnetic generators without completely cut off fluid flow into the thermomagnetic generator. Thus, the problems of mechanical friction and power dissipation are generally reduced, solved or circumvented by using the flow controller.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein:

FIG. 4A is a pictorial drawing of a flow controller of FIG. 2 according to one embodiment of the present disclosure;

FIG. 4B is a partial perspective drawing of the flow controller of FIG. 4A;

FIG. 5A is a pictorial drawing of a flow controller of FIG. 2 according to another embodiment of the present disclosure;

FIG. 5B is a partial perspective drawing of the flow controller of FIG. 5A;

DETAILED DESCRIPTION

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawings.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
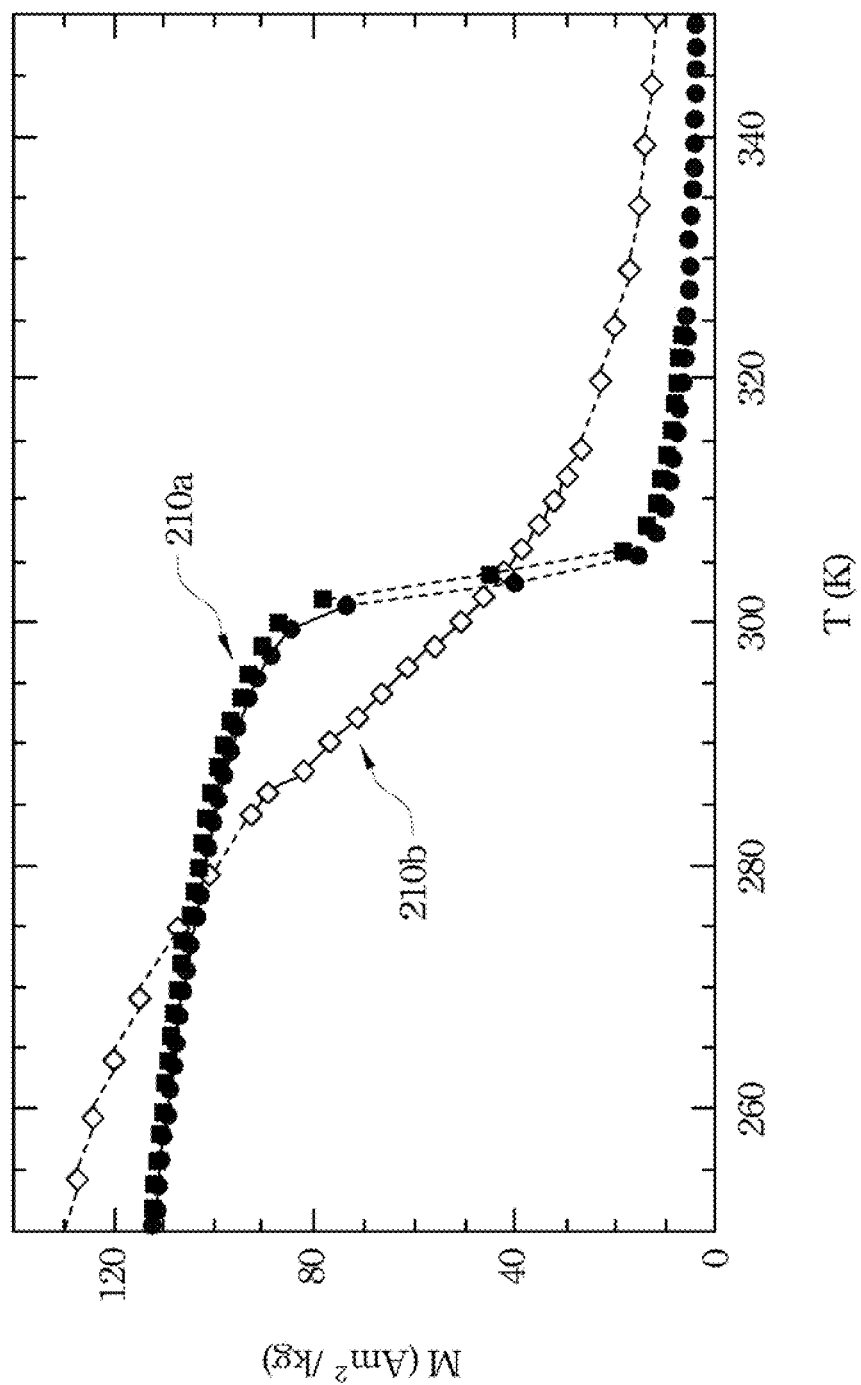
FIG. 1 shows the absolute temperature along the x-axis of the plot and the permeability values for the thermomagnetic materials along the y-axis.

FIG. 1 shows the absolute temperature along the x-axis of the plot and the magnetic reluctivity for the thermomagnetic materials 200a and 200b along the y-axis. As shown in FIG. 1, the first thermomagnetic material 200a or the second thermomagnetic material 200b can act as a high permeability material or a low permeability material by slightly controlling temperature variation. In magnetic field, the thermomagnetic material can be low permeability when the thermomagnetic material is heated to reach a sufficiently high temperature. Alternatively, in magnetic field, the thermomagnetic material can be high permeability when the thermomagnetic material is cooled to reach a sufficiently low temperature. Lenz's law is a common way of understanding how electromagnetic circuits must always obey Newton's third law. Accordingly, a coil can be used for surrounding the thermomagnetic material and thereby generate an induced current when the thermomagnetic material rapidly alternates between high permeability and low permeability.

In practice, heat may be applied to or removed from the thermomagnetic material by means of fluid flow, so as to control the temperature variation of the thermomagnetic material. For a more complete understanding of a mechanism of controlling fluid, please refer to FIG. 2.

Figure 2:
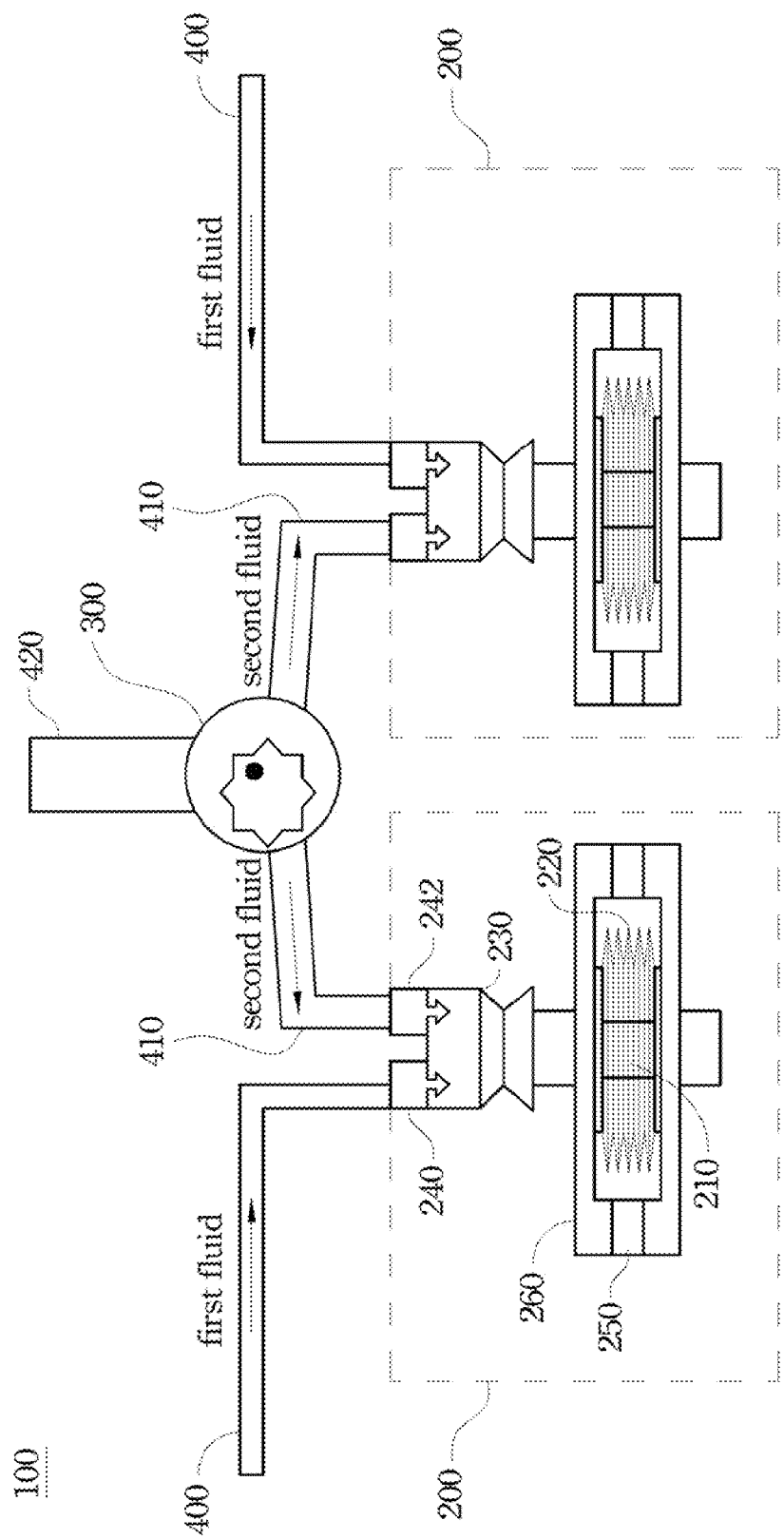
FIG. 2 is a schematic diagram of a power generation device according to one embodiment of the present disclosure.

FIG. 2 is a schematic diagram of a power generation device 100 according to one embodiment of the present disclosure. As shown in FIG. 2, the power generation device 100 includes a plurality of thermomagnetic generators 200 and a flow controller 300. The thermomagnetic generators 200 can acquire first fluids respectively. The flow controller 300 can control flow rates of the second fluids flowing into the respective thermomagnetic generators, wherein a fluid temperature of the first fluid is different from a fluid temperature of the second fluid.

Each of the thermomagnetic generators 200 includes a thermomagnetic material 210, a coil 220 and a fluidic mixer 230. The coil 220 surrounds the thermomagnetic material 210. The fluidic mixer 230 can mix a first fluid with the second fluid and can output the mixed fluid to the thermomagnetic material 210. For example, the fluidic mixer 230 may be a length of piping where the first and second fluids flow together.

In this way, the flow rates of the second fluids flowing into the respective thermomagnetic generators 200 are changed by means of the flow controller 300, and therefore a temperature of the mixed fluid that flows to each thermomagnetic material 210 is changed, so that the thermomagnetic material can alternate between high permeability and a low permeability according as alternate low and high temperature of the mixed fluid. Thus, the coil 220 can be induced to generate power.

In this embodiment, the first and second fluids may be liquids, so as to facilitate transportation. For example, the first fluid is relatively hot water, and the second fluid is relatively cold water. Alternatively, in another embodiment, the first and second fluids may be gas or the like.

For a more complete understanding of transporting the first and second fluids, refer to FIG. 2. As shown in FIG. 1, the power generation device 100 includes a plurality of first fluid conduits 400, a plurality of second fluid conduits 410 and a third fluid conduit 420.

The first fluid conduits 400 are connected to the thermomagnetic generators 200 respectively, so as to deliver the first fluids to the thermomagnetic generators 200 respectively. The second fluid conduits 410 are connected from the flow controller 300 to the thermomagnetic generators respectively, so as to deliver the second fluids to the thermomagnetic generators 300 respectively. The third fluid conduit 420 is connected to the flow controller 300, so as to deliver the second fluids into the flow controller 300.

In use, the first fluids flow into the respective thermomagnetic generators 200 via the first fluid conduits 400. The flow controller 300 acquires a total amount of the second fluids and then delivers the second fluids to the respective thermomagnetic generators 300.

For avoiding a backflow of the thermomagnetic generator 200, each of the thermomagnetic generators 200 includes a first check valve 240 and a second check valve 242. The first check valve 240 is disposed between the first fluid conduit 400 and the fluidic mixer 230 and is connected to the first fluid conduit 400 and the fluidic mixer 230; the second check valve 242 is disposed between the second fluid conduit 410 and the fluidic mixer 230 and is connected to the second fluid conduit 410 and the fluidic mixer 230. In use, the first check valve 240 allows the first fluid into the fluidic mixer 230; the second check valve 242 allows the second fluid into the fluidic mixer 230. Thus, the mixed fluid cannot reversely flow from the fluidic mixer 230 to the first fluid conduit 400 and/or the second fluid conduit 410.

In control experiment, electromagnetic pumps or solenoid valves would be added to the thermomagnetic generator 200 if the flow controller 300 and the third fluid conduit 420 are canceled. Specifically, each thermomagnetic generator 200 needs two electromagnetic pumps or two solenoid valves, wherein one electromagnetic pump or solenoid valve lets the first fluid in the first fluid conduit 400 totally flow into the thermomagnetic generator 200 or completely blocks the first fluid in the first fluid conduit 400 from flowing into the thermomagnetic generator 200, and the other electromagnetic pump or solenoid valve lets the second fluid in the second fluid conduit 410 totally flow into the thermomagnetic generator 200 or completely blocks the second fluid of the second fluid conduit 410 from flowing into the thermomagnetic generator 200.

For example, when one solenoid valve lets hot water in the first fluid conduit 400 flow into the thermomagnetic generator 200, the other solenoid valve blocks cold water of the second fluid conduit 410 from flowing into the thermomagnetic generator 200. On the contrary, when one solenoid valve blocks the hot water of the first fluid conduit 400 from flowing into the thermomagnetic generator 200, the other solenoid valve lets the cold water in the second fluid conduit 410 flow into the thermomagnetic generator 200. Thus, the thermomagnetic material 210 can be changed by alternate hot and cold water.

However, the switching action of the electromagnetic pump or solenoid valve is too slow. For a large-sized electromagnetic pump or solenoid valve, its switching action wastes more time and power. Moreover, it is difficult to cut off fluid completely when the fluid is too large. Because the number of the switching action of the solenoid valve is limited, the solenoid valve may have a breakdown for exceeding this limitation. In use, the electromagnetic pump and solenoid valve each waste electric power; however, the power generation device 100 is used for outputting electricity. Therefore, the use of the electromagnetic pump or solenoid valve diverges from the objective of the power generation device 100.

In view of the foregoing reason, there is no need to use electromagnetic pumps or solenoid valves to block fluid. The electromagnetic pump or solenoid valve must completely cut off fluid flow, which results in serious mechanical friction and power dissipation. In this embodiment, the flow controller 300 guides and distributes fluid to the respective thermomagnetic generators 200 without completely cut off fluid flow into the thermomagnetic generator 200. Thus, the problems of mechanical friction and power dissipation are generally reduced, solved or circumvented by using the flow controller 300.

In FIG. 2, the power generation device 100 has two thermomagnetic generators 200. In one embodiment, the first fluid is hot water, and the second fluid is cold water. In one step, the flow controller 300 can guide and distributes a more portion of the cold water to the right thermomagnetic generator 200 and a less portion of the cold water to the left thermomagnetic generator 200. Therefore, the left thermomagnetic generator 200 mixes the hot water with the less portion of the cold water, in which this mixed water reaches a relatively high temperature, so that the left thermomagnetic material 210 can become low permeability; the right thermomagnetic generator 200 mixes the hot water with the more portion of the cold water, in which this mixed water reaches a relatively low temperature, so that the right thermomagnetic material 210 can become high permeability. In the next step, the flow controller 300 can guide and distributes a more portion of the cold water to the left thermomagnetic generator 200 and a less portion of the cold water to the right thermomagnetic generator 200. Therefore, the right thermomagnetic generator 200 mixes the hot water with the less portion of the cold water, in which this mixed water reaches a relatively high temperature, so that the right thermomagnetic material 210 can become low permeability; the left thermomagnetic generator 200 mixes the hot water with the more portion of the is cold water, in which this mixed water reaches a relatively low temperature, so that the left thermomagnetic material 210 can become high permeability. Then, the aforesaid steps may be repeated in an iterative manner. Thus, each thermomagnetic generator 200 can be induced to generate power by means of alternate hotter and colder water flowing into the thermomagnetic generator 200.

For example, the thermomagnetic material 210 can be changed into high permeability or low permeability by controlling temperature variation from 10° C. to 15° C. In one embodiment, the first fluid is hot water, and the fluid temperature of the first fluid is 50° C.; the second fluid is cold water, and the fluid temperature of the second fluid is 15° C. The constant flow rate of the hot water is 1 L/sec. The flow controller 300 can guide and distributes a more portion of the cold water to the right thermomagnetic generator 200 and a less portion of the cold water to the left thermomagnetic generator 200, wherein a flow rate of the more portion of the cold water is 4 L/sec, and a flow rate of the less portion of the cold water is 1 L/sec. Alternatively, the flow controller 300 can guide and distributes a more portion of the cold water to the left thermomagnetic generator 200 and a less portion of the cold water to the right thermomagnetic generator 200, wherein a flow rate of the more portion of the to cold water is 4 L/sec, and a flow rate of the less portion of the cold water is 1 L/sec. For each thermomagnetic generator 200, the flow rate of the hot water being 1 L/sec is constant, and therefore the temperature of the mixed water can become 32.5° C. when the flow rate of the cold water is 1 L/sec, alternatively, the temperature of the mixed water can become 22° C. when the flow rate of the is cold water is 4 L/sec. Thus, the thermomagnetic material 210 can be changed into high permeability or low permeability due to the sufficient temperature variation that is about 10.5° C.

Figure 3:
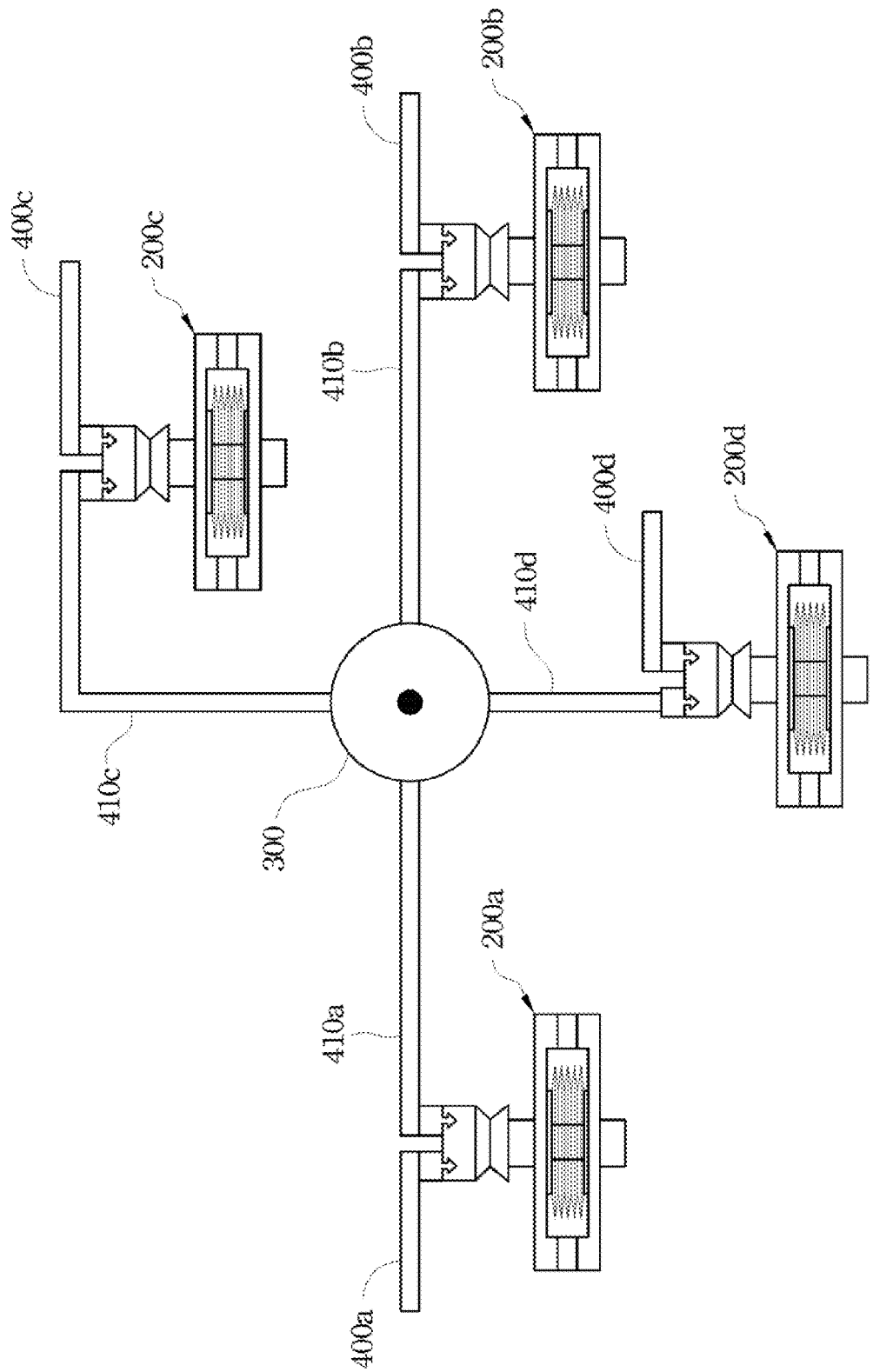
FIG. 3 is a schematic diagram of a power generation device according to another embodiment of the present disclosure.

Furthermore, one flow controller 300 may be associated with two or more thermomagnetic generators. Refer to FIG. 3. FIG. 3 is a schematic diagram of a power generation device according to another embodiment of the present disclosure. As shown in FIG. 3, this power generation device includes a flow controller 300, four thermomagnetic generators 200a, 200b, 200c and 200d, four first fluid conduits 400a, 400b, 400c and 400d, and four second fluid conduits 410a, 410b, 410c and 410d.

In this embodiment, the thermomagnetic generator 200a, 200b, 200c and 200d each are essentially the same as the thermomagnetic generator 200 shown in FIG. 1. The first fluid conduits 400a, 400b, 400c and 400d each are essentially the same as the first fluid conduit 400 shown in FIG. 1. The second fluid conduits 410a, 410b, 410c and 410d each are essentially the same as the second fluid conduit 410 shown in FIG. 1.

In use, the first fluid conduits 400a, 400b, 400c and 400d deliver the first fluids to the thermomagnetic generator 200a, 200b, 200c and 200d respectively. The controller 300 can control the second fluids flowing into some thermomagnetic generators and adjust flow rates of the second fluids flowing into these thermomagnetic generators respectively.

For example, the flow controller 300 can let the second fluids flow into the thermomagnetic generator 200a and 200b via the second fluid conduits 400a and 400b and adjust the flow rates of the second fluids flowing into the respective thermomagnetic generators 200a and 200b; alternatively, the flow controller 300 can let the second fluids flow into the thermomagnetic generator 200c and 200d via the second fluid conduits 400c and 400d and adjust the flow rates of the second fluids flowing into the respective thermomagnetic generators 200c and 200d.

For a more complete understanding of the flow controller 300, refer to FIGS. 4A-4B and 5A-5B. FIG. 4A is a pictorial drawing of the flow controller 300 of FIG. 2 according to one embodiment of the present disclosure. FIG. 4B is a partial perspective drawing of the flow controller 300 of FIG. 4A.

As shown in FIGS. 4A-4B, the flow controller 300 includes a flow splitter 310a, a control valve 320a and a motor 330a, where the flow splitter 310a has an inlet port 312a and a plurality of outlet ports 314a. The motor 330a is a kind of mechanical power device.

As to the flow splitter 310a, its inlet port 312a is connected to the third fluid conduit 420 (shown in FIG. 2) for receiving the second fluid, so that the flow splitter 310a can acquire a total amount of the second fluids. The outlet ports 314a are connected to the second fluid conduits 410 (shown in FIG. 2) respectively, so as to split the second fluids into the respective thermomagnetic generators 200.

As shown in FIG. 4B, the control valve 320a is configured in the flow in splitter 310a, and the motor 330a is connected to the control valve 320a. In use, the motor 330a drives the control valve 320a, so as to adjust the flow rates of the second fluids flowing from the outlet ports 314a into the thermomagnetic generators 200 respectively.

In this embodiment, the control valve 320a is an eccentric. The motor 330a drives the eccentric to change a direction of the working fluid. The direction of the working fluid is changed rapidly because the rotation rate of the motor can reach 1000 or more revolutions per minute (RPM).

As shown in FIGS. 4A-4B, the flow controller 300 may include a flywheel 340a. The flywheel 340a is disposed between the control valve 320a and the motor 330a, and the motor 330a is connected to the control valve 320a via an axle center of the flywheel 340a. During the motor 330a is operating, the torsion and instability of the motor 330a can be reduced by means of the flywheel 340a.

FIG. 5A is a pictorial drawing of the flow controller 300 of FIG. 2 according to another embodiment of the present disclosure. FIG. 5B is a partial perspective drawing of the flow controller 300 of FIG. 5A. As shown in FIGS. 5A-5B, the flow controller 300 includes a flow splitter 310b, a control valve 320b and a motor 330b, where the flow splitter 310b has an inlet port 312b and a plurality of outlet ports 314b.

As to the flow splitter 310b, its inlet port 312b is connected to the third fluid conduit 420 (shown in FIG. 2) for receiving the second fluid, so that the flow splitter 310b can acquire a total amount of the second fluids. The outlet ports 314b are connected to the second fluid conduits 410 (shown in FIG. 2) respectively, so as to split the second fluids into the respective thermomagnetic generators 200.

As shown in FIG. 5B, the control valve 320b is configured in the flow splitter 310b, and the motor 330b is connected to the control valve 320b. In use, the motor 330a drives the control valve 320b, so as to adjust the flow rates of the second fluids flowing from the outlet ports 314b into the thermomagnetic is generators 200 respectively.

As shown in FIGS. 5A-5B, the flow controller 300 may include a flywheel 340a. The flywheel 340b is disposed between the control valve 320b and the motor 330b, and the motor 330b is connected to the control valve 320b via an axle center of the flywheel 340b. During the motor 330b is operating, the torsion and instability of the motor 330b can be reduced by means of the flywheel 340b.

Figure 6:
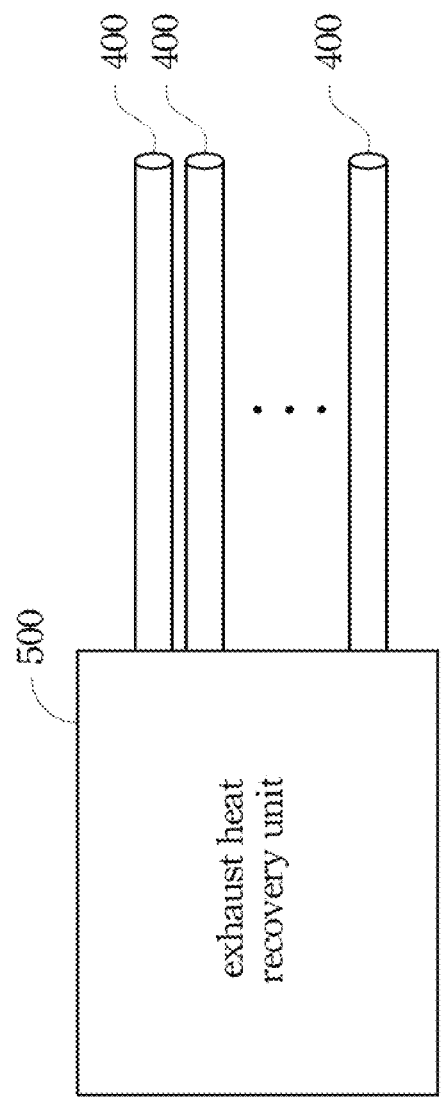
FIG. 6 is a block diagram of an exhaust heat recovery unit according to one embodiment of the present disclosure.

In industrial processes, waste heat or used heat usually is released into ambient environment without further use. For efficiently utilizing waste heat, please refer to FIG. 6. FIG. 6 is a block diagram of an exhaust heat recovery unit 500 according to one embodiment of the present disclosure. As shown in FIG. 6, the exhaust heat recovery unit 500 can recycle the waste heat and output the first fluid that is heated by the recycled waste heat. Of the first fluid conduits 400 each acquire the first fluid from the exhaust heat recovery unit 500, wherein the fluid temperature of the first fluid is higher than the fluid temperature of the second fluid. Thus, the thermomagnetic generator 200 can receive hotter fluid from the first fluid conduit 400.

In another embodiment, the first fluid may be heated by means of terrestrial heat, so as to provide hotter fluid for the thermomagnetic generator 200.

Each of the thermomagnetic generators may further include at least one magnet and at least one yoke. The magnet, the yoke and the thermomagnetic material constitute a closed magnetic circuit. The magnet is a permanent magnet or an electric magnet.

Figure 7A:
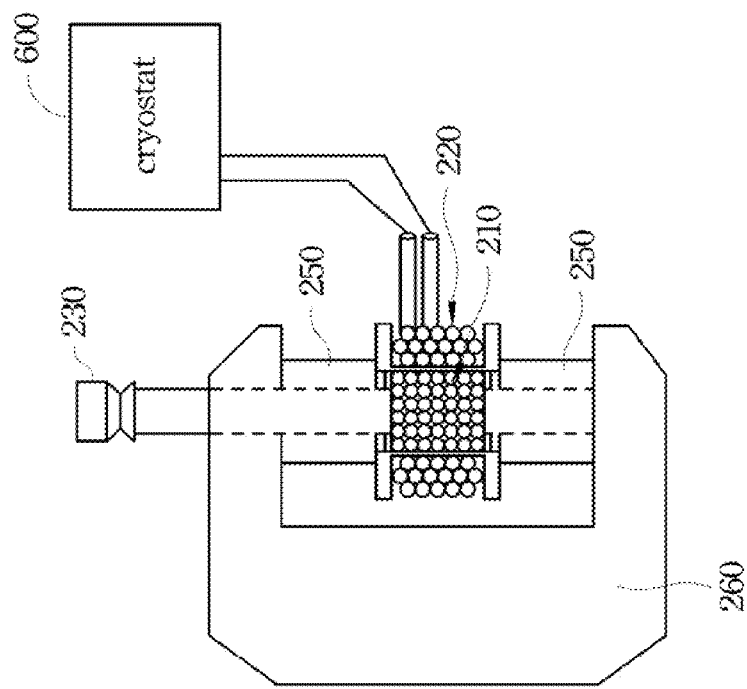
FIG. 7A is a schematic diagram of a thermomagnetic generator of FIG. 2 according to one embodiment of the present disclosure.

FIG. 7A is a schematic diagram of a thermomagnetic generator 200 of FIG. 2 according to one embodiment of the present disclosure. As shown in FIG. 7A, the thermomagnetic generator 200 includes two separate magnets 250 and two separate yokes 260. In a magnetic path, the two magnets 250 and the thermomagnetic material 210 are disposed between the two yokes 260. The opposing sides of each of the two yokes 260 are connected to the two magnets 250 respectively, and a central part of each of the two yokes 260 is connected to the thermomagnetic material 210. Therefore, the magnets 250, the yokes 260 and the thermomagnetic material 210 constitute a closed magnetic circuit. Thus, the magnetic line of force is created along the closed magnetic circuit, so that magnetic energy is sufficiently utilized for increasing the power generation efficiency of the thermomagnetic generator.

In FIG. 7A, the coil 220 may be a superconducting coil for reducing transmission loss. The thermomagnetic generator 200 may include a cryostat 600. In use, the cryostat 600 adjusts a temperature of the superconducting coil, so that the superconducting coil can be maintained at ultra-low temperature. Thus, the superconducting coil at ultra-low temperature has very small resistance or approximately zero-resistance.

Figure 7B:
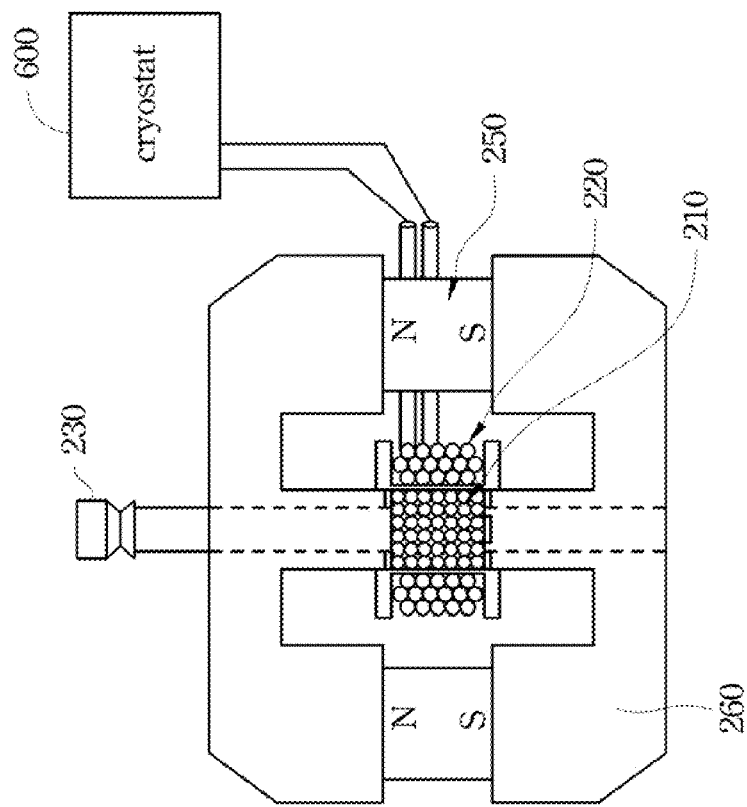
FIG. 7B is a schematic diagram of a thermomagnetic generator of FIG. 2 according to another embodiment of the present disclosure.

FIG. 7B is a schematic diagram of a thermomagnetic generator of FIG. 2 according to another embodiment of the present disclosure. As shown in FIG. 7B, the thermomagnetic generator 200 includes two separate magnets 250 and a single yoke 260. The two magnets 250 are connected to opposing sides of the thermomagnetic material 210 respectively, and two ends of the yoke 260 clamp and are connected to the two magnets 250 respectively. Therefore, the magnets 250, the yoke 260 and the thermomagnetic material 210 constitute a closed magnetic circuit. Thus, the magnetic line of force is created along the closed magnetic circuit, so that magnetic energy is sufficiently utilized for increasing the power generation efficiency of the thermomagnetic generator.

In FIG. 7B, the coil 220 may be a superconducting coil for reducing transmission loss. The thermomagnetic generator 200 may include a cryostat 600 for maintaining the superconducting coil at a low temperature.

Moreover, the form of the thermomagnetic material 210 may be a plurality of pellets or masses. The fluid can flow through small opening or space between these pellets or masses. For avoiding that the fluid containing impurity adversely affects the thermomagnetic material 210, the surface of the thermomagnetic material 210 may be coated with a protective film; alternatively, the thermomagnetic material 210 is disposed within the sealed container, and therefore the fluid flows to the sealed container without affecting the thermomagnetic material 210.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A power generation device comprising:
   a plurality of thermomagnetic generator, each of the thermomagnetic generators comprising:
      a thermomagnetic material;
      a coil surrounding the thermomagnetic material; and
      a fluidic mixer for mixing a first fluid with a second fluid and for outputting the mixed fluid to the thermomagnetic material, wherein a fluid temperature of the first fluid is different from a fluid temperature of the second fluid;
   a flow controller for controlling flow rates of the second fluid flowing into the thermomagnetic generators respectively;
   a plurality of first fluid conduits connected to the thermomagnetic generators respectively, so as to deliver the first fluid to the thermomagnetic generators respectively; and
   a plurality of second fluid conduits connected from the flow controller to the thermomagnetic generators respectively, so as to deliver the second fluid to the thermomagnetic generators respectively.

2. The power generation device of claim 1, wherein each of the thermomagnetic generators further comprises:
   a first check valve connected to one of the first fluid conduits for allowing the first fluid into the fluidic mixer; and
   a second check valve connected to one of the second fluid conduits for allowing the second fluid into the fluidic mixer.

3. The power generation device of claim 1, wherein the flow controller comprises:
   a flow splitter comprising:
      an inlet port for acquiring a total amount of the second fluid; and
      a plurality of outlet ports connected to the second fluid conduits respectively;
   a control valve configured in the flow splitter; and
   a mechanical power device connected to the control valve for driving the control valve, so as to adjust the flow rates of the second fluid flowing from the outlet ports into the thermomagnetic generators respectively.

4. The power generation device of claim 3, wherein the control valve is an eccentric or a ball valve, and the mechanical power device is a motor.

5. The power generation device of claim 3, wherein the flow controller further comprises:
   a flywheel disposed between the control valve and the mechanical power device, wherein the mechanical power device is connected to the control valve via an axle center of the flywheel.

6. The power generation device of claim 1, wherein the first fluid conduits acquire the first fluid from an exhaust heat recovery unit, wherein the fluid temperature of the first fluid is higher than the fluid temperature of the second fluid, or the fluid temperature of the second fluid is higher than the fluid temperature of the first fluid.

7. The power generation device of claim 1, wherein each of the thermomagnetic generators further comprises:
   at least one magnet; and
   at least one yoke connected to the magnet, wherein said at least one magnet, said at least one yoke and the thermomagnetic material constitute a magnetic circuit.

8. The power generation device of claim 7, wherein said thermomagnetic generator comprises two magnets and two yokes, wherein the two magnets and the thermomagnetic material are disposed between the two yokes, wherein opposing sides of each of the two yokes are connected to the two magnets respectively, and a central part of each of the two yokes is connected to the thermomagnetic material.

9. The power generation device of claim 7, wherein said thermomagnetic generator comprises two magnets and a yoke, wherein the two magnets are connected to opposing sides of the thermomagnetic material respectively, and two ends of the yoke are connected to the two magnets respectively.

10. The power generation device of claim 1, wherein the coil is a superconducting coil or an electromagnetic coil.

11. The power generation device of claim 10, wherein each of the thermomagnetic generators further comprises:
    a cryostat for adjusting a temperature of the superconducting coil.

12. The power generation device of claim 1, wherein the first and second fluids are water, liquids, gas or a mixture of liquid and gas.

13. A power generation device comprising:
    a plurality of thermomagnetic generators for acquiring first fluids respectively; and
    a flow controller for controlling flow rates of second fluids flowing into the thermomagnetic generators respectively, wherein a fluid temperature of the first fluid is different from a fluid temperature of the second fluid,
    where the flow controller comprises:
    a flow splitter, comprising:
       an inlet port for receiving the second fluids; and
       a plurality of outlet ports connected to the thermomagnetic generators respectively;
    a control valve configures in the flow splitter; and
    a mechanical power device connected t the control valve for the driving the control valve, so as to adjust the flow rates of the second fluids flowing from the outlet ports into the thermomagnetic generators respectively,
    wherein each of the thermomagnetic generators comprises:
       a thermomagnetic material; a coil surrounding the thermomagnetic material; a first check for acquiring the first fluid; a second check valve for acquiring the second fluid from one of the outlet ports; and a fluid mixer connected to the first and second check valves for mixing the first fluid with the second fluid to output the mixed fluid into the thermomagnetic material.

14. The power generation device of claim 13, wherein the control valve is an eccentric or a ball valve.

15. The power generation device of claim 13, wherein the flow controller further comprises:

a flywheel disposed between the control valve and the mechanical power device, wherein the mechanical power device is connected to the control valve via an axle center of the flywheel.

16. The power generation device of claim 13, wherein each of the thermomagnetic generators further comprising:
   at least one magnet; and
   at least one yoke connected to the magnet, wherein the magnet, the yoke and the thermomagnetic material constitute a magnetic circuit.

* * * * *